United States Patent
Tajima et al.

(10) Patent No.: US 8,816,367 B2
(45) Date of Patent: Aug. 26, 2014

(54) SEMICONDUCTOR LIGHT EMITTING DEVICE AND METHOD FOR MANUFACTURING SAME

(71) Applicants: Jumpei Tajima, Tokyo (JP); Kotaro Zaima, Tokyo (JP); Hiroshi Ono, Tokyo (JP); Shinji Yamada, Kanagawa-ken (JP); Shigeya Kimura, Kanagawa-ken (JP); Naoharu Sugiyama, Kanagawa-ken (JP); Shinya Nunoue, Chiba-ken (JP)

(72) Inventors: Jumpei Tajima, Tokyo (JP); Kotaro Zaima, Tokyo (JP); Hiroshi Ono, Tokyo (JP); Shinji Yamada, Kanagawa-ken (JP); Shigeya Kimura, Kanagawa-ken (JP); Naoharu Sugiyama, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/727,147

(22) Filed: Dec. 26, 2012

(65) Prior Publication Data

US 2013/0328075 A1 Dec. 12, 2013

(30) Foreign Application Priority Data

Jun. 11, 2012 (JP) .................................. 2012-132221

(51) Int. Cl.
*H01L 33/22* (2010.01)
(52) U.S. Cl.
USPC .............................................. 257/94; 438/44
(58) Field of Classification Search
USPC ...................................................... 257/94, 79
See application file for complete search history.

(56) References Cited

U.S. PATENT DOCUMENTS

| 5,369,289 A | * | 11/1994 | Tamaki et al. | 257/99 |
| 5,821,571 A | * | 10/1998 | Lebby et al. | 257/98 |
| 7,576,364 B2 | * | 8/2009 | Lee et al. | 257/95 |
| 2011/0220911 A1 | | 9/2011 | Katsuno et al. | |
| 2011/0220932 A1 | * | 9/2011 | Katsuno et al. | 257/98 |

FOREIGN PATENT DOCUMENTS

| JP | 2006-210824 | 8/2006 |
| JP | 2008-153584 | 7/2008 |
| JP | 2009-76896 | 4/2009 |
| JP | 2011-187872 | 9/2011 |

OTHER PUBLICATIONS

U.S. Appl. No. 14/083,927, filed Nov. 19, 2013, Tajima, et al.
Office Action mailed Jun. 17, 2014, in Japanese Patent Application No. 2012-132221 (with English-language translation).

* cited by examiner

*Primary Examiner* — Thao P Le
(74) *Attorney, Agent, or Firm* — Oblon, Spivak, McClelland, Maier & Neustadt, L.L.P.

(57) ABSTRACT

According to one embodiment, a semiconductor light emitting device includes first and second electrodes, first and second semiconductor layers and a light emitting layer. The first electrode includes a first region, a second region, and a third region provided between them. The first semiconductor layer includes a first portion on the first region and a second portion on the second region. The light emitting layer includes a third portion on the first portion and a fourth portion on the second portion. The second semiconductor layer includes a fifth portion on the third portion and a sixth portion on the fourth portion. The insulating layer is provided between the first and second portions on the third region and between the third and fourth portions. The second electrode includes a seventh portion provided on the insulating layer, eighth and ninth portions contacting side surfaces of the fifth and sixth portions.

20 Claims, 8 Drawing Sheets

SEMICONDUCTOR LIGHT EMITTING DEVICE AND METHOD FOR MANUFACTURING SAME

CROSS-REFERENCE TO RELATED APPLICATIONS

This application is based upon and claims the benefit of priority from the prior Japanese Patent Application No. 2012-132221, filed on Jun. 11, 2012; the entire contents of which are incorporated herein by reference.

FIELD

Embodiments described herein relate generally to a semiconductor light emitting device and a method for manufacturing a semiconductor light emitting device.

BACKGROUND

Semiconductor light emitting devices such as light emitting diodes (LED) and laser diodes (LD) have been developed. In a semiconductor light emitting device, for instance, a nitride semiconductor layer of e.g. gallium nitride is crystal grown on a growth substrate. Here, if there is a large difference in thermal expansion coefficient between the growth substrate and the semiconductor layer, then after the crystal growth and return to room temperature, crystallinity degradation or cracks may occur and decrease the quality.

DETAILED DESCRIPTION

Figure 1:
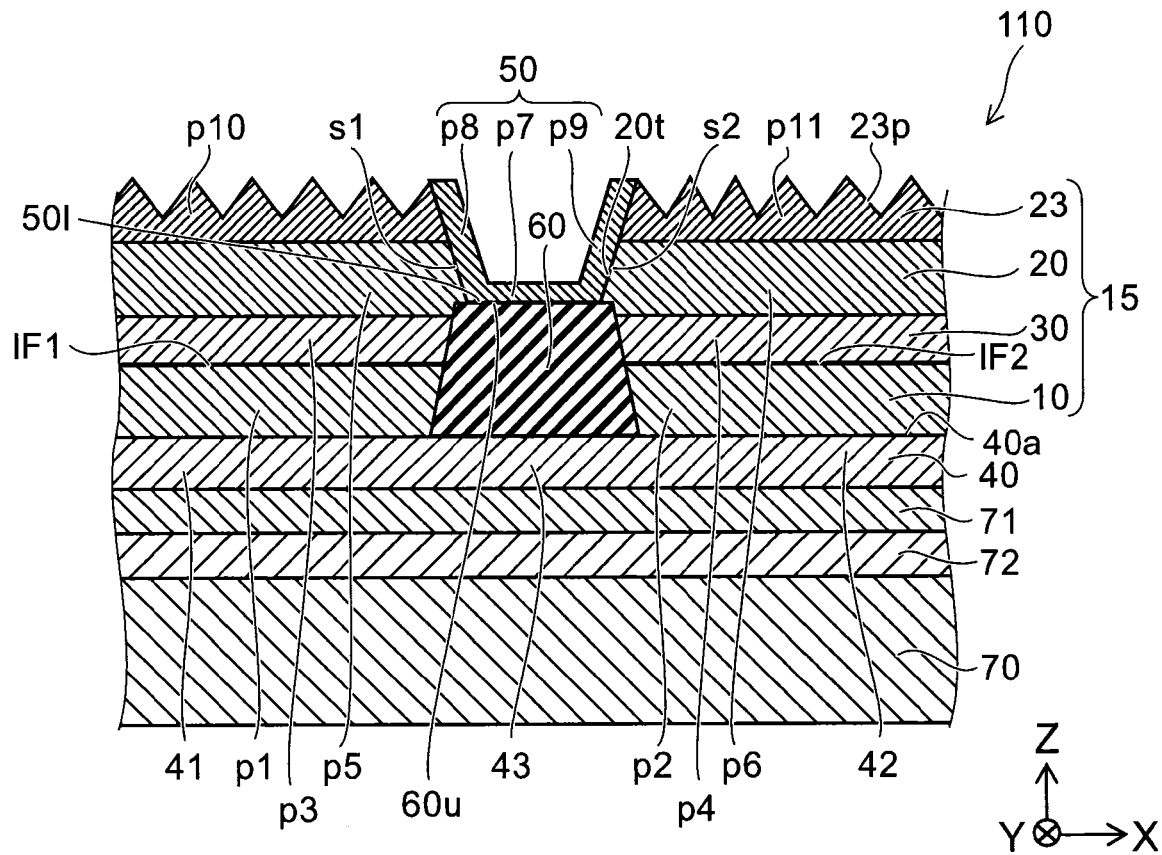
FIG. 1 is a schematic sectional view illustrating the configuration of a semiconductor light emitting device according to a first embodiment.

According to one embodiment, a semiconductor light emitting device includes a first electrode, a first semiconductor layer of a first conductivity type, a light emitting layer, a second semiconductor layer of a second conductivity type, an insulating layer, and a second electrode. The first electrode has a major surface. The first electrode includes a first region, a second region apart from the first region in a plane parallel to the major surface, and a third region provided between the first region and the second region. The first semiconductor layer includes a first portion provided on the first region and a second portion provided on the second region. The light emitting layer includes a third portion provided on the first portion and a fourth portion provided on the second portion. The second semiconductor layer includes a fifth portion provided on the third portion and a sixth portion provided on the fourth portion. The fifth portion has a first side surface opposing the sixth portion. The sixth portion has a second side surface opposing the fifth portion. The insulating layer is provided between the first portion and the second portion on the third region and between the third portion and the fourth portion. The second electrode includes a seventh portion provided on the insulating layer, an eighth portion in contact with the first side surface, and a ninth portion in contact with the second side surface.

According to one embodiment, a method for manufacturing a semiconductor light emitting device is provided. The method can include preparing a stacked body including a growth substrate, a first semiconductor film of a first conductivity type, a second semiconductor film of a second conductivity type provided between the growth substrate and the first semiconductor film, and a light emitting film provided between the first semiconductor film and the second semiconductor film. The method can include forming a first trench dividing the first semiconductor film and the light emitting film. The method can include forming an insulating layer on a side surface of the first semiconductor film exposed in the first trench and a side surface of the light emitting film exposed in the first trench. The method can include forming a first electrode on an upper surface of the first semiconductor film and on the insulating layer. The method can include bonding a support substrate to the first electrode, the support substrate being conductive. The method can include removing the growth substrate. The method can include forming a second trench to divide the second semiconductor film and to reach the insulating layer. The method can include forming a second electrode on a side surface of the second semiconductor film exposed in the second trench.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

First Embodiment

FIG. 1 is a schematic sectional view illustrating the configuration of a semiconductor light emitting device according to a first embodiment.

Figure 2:
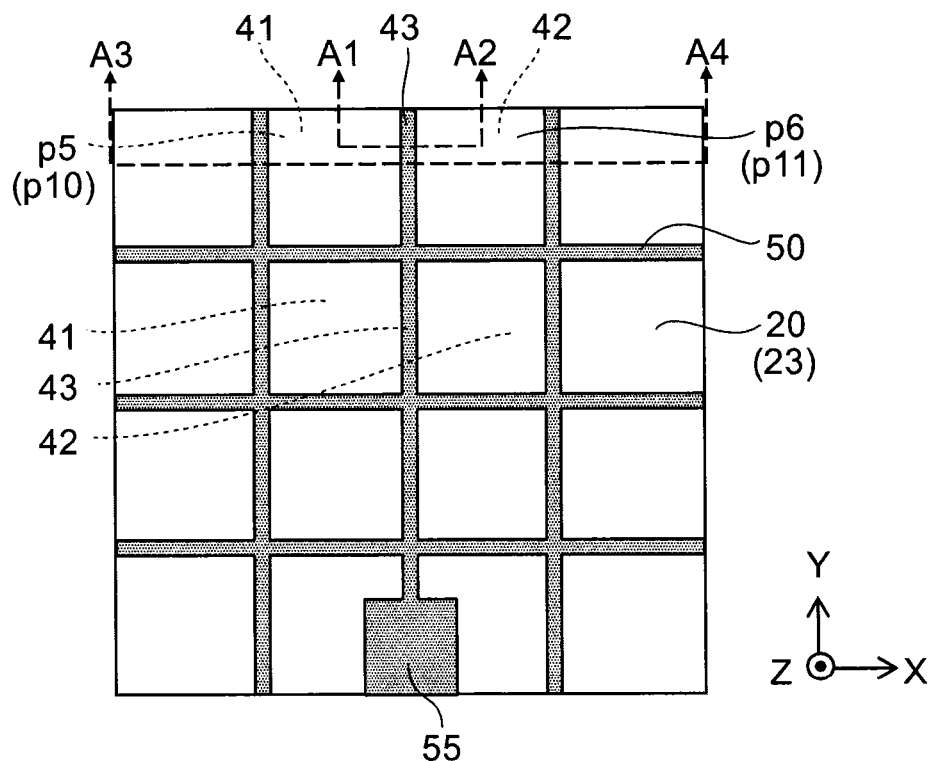
FIG. 2 is a schematic plan view illustrating the configuration of the semiconductor light emitting device according to the first embodiment.

FIG. 2 is a schematic plan view illustrating the configuration of the semiconductor light emitting device according to the first embodiment. FIG. 1 is a sectional view taken along line A1-A2 of FIG. 2.

As shown in FIGS. 1 and 2, the semiconductor light emitting device 110 according to this embodiment includes a first electrode 40, a first semiconductor layer 10, a light emitting layer 30, a second semiconductor layer 20, an insulating layer 60, and a second electrode 50.

The first electrode has a major surface 40a. The first electrode 40 includes a first region 41, a second region 42, and a third region 43. The second region 42 is apart from the first region 41 in a plane parallel to the major surface 40a. The third region 43 is provided between the first region 41 and the second region 42.

The direction perpendicular to the major surface of the first electrode 40 is referred to as Z-axis direction. One direction perpendicular to the Z-axis direction is referred to as X-axis direction. The direction perpendicular to the Z-axis direction and the X-axis direction is referred to as Y-axis direction.

For instance, the shape of the semiconductor light emitting device 110 as viewed along the Z-axis direction (planar shape) is a rectangle. One side of the planar shape of the semiconductor light emitting device 110 lies along e.g. the X-axis direction. Another side of the planar shape of the semiconductor light emitting device 110 lies along e.g. the Y-axis direction.

As illustrated in FIG. 2, in this example, the third region 43 is provided in a lattice configuration in the X-Y plane. The third region 43 is a region dividing the first region 41 and the second region 42.

For instance, the first direction from the first region 41 toward the second region 42 is parallel to the X-axis direction. However, the embodiment is not limited thereto. The first direction can be set to an arbitrary direction parallel to the X-Y plane. That is, the relationship between the first direction from the first region 41 toward the second region 42 and the direction of the side of the semiconductor light emitting device 110 is arbitrary. In the following description, it is assumed that the first direction is parallel to the X-axis direction.

In this example, the first region 41 and the second region 42 are each provided in a plurality. The plurality of first regions 41 are arranged in a second direction non-parallel to the first direction from the first region 41 toward the second region 42. The plurality of second regions 42 are arranged along the second direction. In this example, the second direction is the Y-axis direction.

Thus, a plurality of first regions 41 and a plurality of second regions 42 are placed in a lattice configuration. In the embodiment, the number of the plurality of first regions 41 and the number of the plurality of second regions 42 are arbitrary.

As illustrated in FIG. 2, the semiconductor light emitting device 110 can further include a pad section 55. The pad section 55 is electrically connected to the second electrode 50. The second electrode 50 constitutes e.g. a narrow wire electrode.

As illustrated in FIG. 1, the first semiconductor layer 10 is of a first conductivity type. The first semiconductor layer 10 includes a first portion p1 and a second portion p2. The first portion p1 is provided on the first region 41. The second portion p2 is provided on the second region 42.

The light emitting layer 30 includes a third portion p3 and a fourth portion p4. The third portion p3 is provided on the first portion p1. The fourth portion p4 is provided on the second portion p2.

The second semiconductor layer 20 is of a second conductivity type. The second semiconductor layer 20 includes a fifth portion p5 and a sixth portion p6. The fifth portion p5 is provided on the third portion p3. The sixth portion p6 is provided on the fourth portion p4. The second semiconductor layer 20 has a first side surface s1 of the fifth portion p5 opposing the sixth portion p6, and a second side surface s2 of the sixth portion p6 opposing the fifth portion p5. The first side surface s1 opposes the second side surface s2 along the first direction. The second side surface s2 opposes the first side surface s1 along the first direction. That is, the fifth portion p5 has the first side surface s1 which opposes the sixth portion p6, and the sixth portion p6 has the second side surface s2 which opposes the fifth portion p5.

The first conductivity type is e.g. p-type, and the second conductivity type is e.g. n-type. However, the embodiment is not limited thereto. The first conductivity type may be n-type, and the second conductivity type may be p-type. In the following description, it is assumed that the first conductivity type is p-type, and the second conductivity type is n-type.

The first semiconductor layer 10, the second semiconductor layer 20, and the light emitting layer 30 include nitride semiconductor. For instance, the first semiconductor layer 10 includes p-type GaN. The second semiconductor layer 20 includes n-type GaN. Examples of the first semiconductor layer 10, the second semiconductor layer 20, and the light emitting layer 30 are described later.

The insulating layer 60 is provided between the first portion p1 and the second portion p2 and between the third portion p3 and the fourth portion p4 on the third region 43. The insulating layer 60 divides the first portion p1 and the second portion p2 of the first semiconductor layer 10. The insulating layer 60 divides the third portion p3 and the fourth portion p4 of the light emitting layer 30. In this example, the insulating layer 60 is provided in a lattice configuration along the third region 43. Thus, the first semiconductor layer 10 is divided in a lattice configuration. The light emitting layer 30 is also divided in a lattice configuration.

The insulating layer 60 is made of an insulating material such as metal oxide, metal nitride, or metal oxynitride. The insulating layer 60 is made of e.g. silicon oxide (e.g., $SiO_2$), silicon nitride (SiN), or silicon oxynitride (SiON).

The second electrode 50 includes a seventh portion p7, an eighth portion p8, and a ninth portion p9. The seventh portion p7 is provided on the insulating layer 60. The eighth portion p8 is in contact with the first side surface s1 (the side surface of the fifth portion p5 opposing the sixth portion p6) of the second semiconductor layer 20. The ninth portion p9 is in contact with the second side surface s2 (the side surface of the sixth portion p6 opposing the fifth portion p5) of the second semiconductor layer 20.

For instance, the eighth portion p8 is in ohmic contact with the first side surface s1. The ninth portion p9 is in ohmic contact with the second side surface s2. Thus, the second electrode 50 is in ohmic contact with the second semiconductor layer 20 at the side surface of the second semiconductor layer 20.

In this example, the semiconductor light emitting device 110 further includes a third semiconductor layer 23. The third semiconductor layer 23 includes a tenth portion p10 provided on the fifth portion p5, and an eleventh portion p11 provided on the sixth portion p6. The impurity concentration in the third semiconductor layer 23 is lower than the impurity concentration in the second semiconductor layer 20 (fifth portion p5 and sixth portion p6). The third semiconductor layer 23 includes e.g. a GaN layer not doped with impurity (i-GaN layer). In this example, the third semiconductor layer 23 has an unevenness 23p provided on the upper surface of the third semiconductor layer 23. The depth of this unevenness 23p is preferably 0.8 times or more and 5 times or less the peak wavelength of the light emitted from the light emitting layer 30 (emission light). By the unevenness 23p, the light emitted from the light emitting layer 30 can be efficiently extracted to the outside of the device.

The third semiconductor layer 23 is provided as necessary, and may be omitted. Examples of the third semiconductor layer 23 are described later.

The eighth portion p8 of the second electrode 50 is further in contact with the side surface of the tenth portion p10 opposing the eleventh portion p11 of the third semiconductor layer 23. The ninth portion p9 of the second electrode 50 is further in contact with the side surface of the eleventh portion p11 opposing the tenth portion p10 of the third semiconductor layer 23.

That is, in the second semiconductor layer 20 (and the third semiconductor layer 23), a lattice-shaped trench (second trench 20t) is provided along the lattice-shaped third region 43. The second trench 20t divides the second semiconductor layer (and the third semiconductor layer 23) in a lattice configuration. A conductive layer is provided in the second trench 20t to form the second electrode 50. The second electrode 50 is electrically connected to the side surface (first side surface s1 and second side surface s2) of the second semiconductor layer 20 exposed at the inner wall of the second trench 20t.

On the other hand, the insulating layer 60 electrically insulates the first semiconductor layer 10 from the second electrode 50, and electrically insulates the light emitting layer 30 from the second electrode 50.

In the semiconductor light emitting device 110, a voltage is applied between the first electrode 40 and the second electrode 50. Through the first semiconductor layer 10 and the second semiconductor layer 20, a current is supplied to the light emitting layer 30. Thus, light is emitted from the light emitting layer 30. The peak wavelength of the emission light is e.g. 370 nanometers (nm) or more and 700 nm or less.

The semiconductor light emitting device 110 includes a stacked semiconductor layer 15 including the first semiconductor layer 10, the light emitting layer 30, and the second semiconductor layer 20. In the case where the third semiconductor layer 23 is provided, the stacked semiconductor layer 15 also includes the third semiconductor layer 23. In the semiconductor light emitting device 110, the stacked semiconductor layer 15 is divided into a plurality of regions in the X-Y plane. Specifically, the light emitting layer 30 and the first semiconductor layer 10 are divided by the insulating layer 60. The second semiconductor layer 20 is divided by the second electrode 50 (i.e., second trench 20t). Thus, each area of the plurality of regions of the stacked semiconductor layer 15 is made smaller than that without division.

For instance, when the crystal layer of the stacked semiconductor layer 15 is grown on the growth substrate, an excessive stress is applied to the crystal due to large difference in thermal expansion coefficient between the crystal layer and the growth substrate. This causes crystallinity degradation and cracks.

However, in this embodiment, the stacked semiconductor layer 15 is divided to reduce the size of the semiconductor layer. Thus, even in the case where a stress is applied to the semiconductor layer, crystallinity degradation and cracks can be suppressed. The embodiment can provide a semiconductor light emitting device of high quality. Thus, in the embodiment, a configuration of relaxing the residual stress accumulated in the stacked semiconductor layer 15 is introduced. This can suppress the occurrence of cracks.

In particular, the difference in thermal expansion coefficient between nitride semiconductor (e.g., GaN) and silicon is relatively large. Thus, a particularly large stress occurs in the case where the stacked semiconductor layer 15 of nitride semiconductor is grown on a growth substrate of silicon. Accordingly, in the case of forming a nitride semiconductor layer on a silicon substrate, crystallinity degradation and cracks can be suppressed more effectively by providing the configuration of the embodiment.

In this example, the semiconductor light emitting device 110 further includes a support substrate 70, a first intermediate conductive layer 71, and a second intermediate conductive layer 72. The support substrate 70 is conductive. The support substrate 70 is e.g. a conductive silicon substrate. On the support substrate 70, the first electrode 40 is provided. That is, the first electrode 40 is placed between the support substrate 70 and the first semiconductor layer 10. The first intermediate conductive layer 71 is provided between the support substrate 70 and the first electrode 40. The second intermediate conductive layer 72 is provided between the support substrate 70 and the first intermediate conductive layer 71. For instance, the first intermediate conductive layer 71 is formed on the surface (lower surface) of the first electrode 40. The second intermediate conductive layer 72 is formed on the surface of the support substrate 70. The first intermediate conductive layer and the second intermediate conductive layer 72 are opposed and bonded to each other. Thus, the support substrate 70 is bonded to the first electrode 40.

The first intermediate conductive layer 71 is e.g. an adhesive metal layer. The first intermediate conductive layer 71 is made of e.g. Ti or Ti alloy. The second intermediate conductive layer 72 is e.g. a bonding metal layer. The second intermediate conductive layer 72 is made of e.g. AuSn alloy.

The semiconductor light emitting device 110 is e.g. a semiconductor light emitting device of the thin film type. As described later, in the semiconductor light emitting device 110, a semiconductor layer is crystal grown on a growth substrate. Then, a support substrate is bonded to the semiconductor layer. Subsequently, the growth substrate is removed. In the configuration in which the thin semiconductor layer thus processed is removed from the growth substrate, the crystal quality is more prone to degradation. For instance, in particular, the configuration is such that a semiconductor layer is crystal grown on a growth substrate of silicon, and then the growth substrate is removed. By applying this embodiment to such a configuration, crystallinity degradation and cracks are effectively suppressed.

In this description, the term "bonded" includes not only the state of being directly fixed, but also the state of being fixed with another element interposed in between. The term "provided on" includes not only the state of being placed in direct contact, but also the state of being placed with another element interposed in between. The term "to oppose" includes not only the state of directly facing, but also indirectly facing with another element interposed in between. The term "stacked" includes not only the state of being stacked in contact with each other, but also the state of being stacked with another layer interposed in between.

There is a configuration in which a plurality of semiconductor light emitting device chips are placed on a base body, and the electrodes thereof are connected to each other to form a light emitting apparatus. This configuration is complex to manufacture. In this case, the semiconductor light emitting device chips are individually placed on the base body. Thus, the distance between the base body and the semiconductor layer varies for each semiconductor light emitting device chip. Furthermore, the crystal orientation in the semiconductor layer varies for each semiconductor light emitting device chip.

In contrast, in the semiconductor light emitting device 110 according to the embodiment, as described later, the stacked semiconductor layer 15 formed on one growth substrate is divided. Thus, the distance between the growth substrate and the semiconductor layer is constant among a plurality of regions. Furthermore, the crystal orientation in the semiconductor layer is constant among a plurality of regions. Thus, for instance, the distance from the interface between the first semiconductor layer 10 and the light emitting layer 30 to the first electrode 40 is constant.

For instance, as illustrated in FIG. 1, the distance from the interface IF1 (a first interface) between the first portion p1 and the third portion p3 to the first electrode 40 is equal to the distance from the interface IF2 (a second interface) between the second portion p2 and the fourth portion p4 to the first electrode 40. For instance, the crystal orientation in the first portion p1 is equal to the crystal orientation in the second portion p2. For instance, the crystal orientation in the third portion p3 is equal to the crystal orientation in the fourth portion p4. For instance, the crystal orientation in the fifth portion p5 is equal to the crystal orientation in the sixth portion p6. Thus, the distance between the singulated regions is made narrower than the width of the insulating layer. This configuration has higher chip packaging density than a configuration in which, for instance, a plurality of semiconductor light emitting device chips are placed on a base body, and the electrodes thereof are connected to each other to form a light emitting apparatus. Furthermore, this configuration is advantageous for cost reduction.

Furthermore, it is also possible to consider a configuration in which the stacked semiconductor layer 15 (first semiconductor layer 10, light emitting layer 30, and second semiconductor layer 20) is not divided. In this configuration, for instance, the first semiconductor layer 10 and the light emitting layer 30 are divided, but the second semiconductor layer 20 is not divided. Alternatively, for instance, the first semiconductor layer 10 is divided, but the light emitting layer 30 and the second semiconductor layer 20 are not divided. However, in the configuration in which one of the layers included in the stacked semiconductor layer 15 is not divided, the stress is not relaxed in the undivided layer. Thus, it is difficult to suppress the occurrence of cracks.

In the embodiment, by dividing the stacked semiconductor layer 15 (first semiconductor layer 10, light emitting layer 30, and second semiconductor layer 20), the applied stress is effectively dispersed. Thus, a semiconductor light emitting device of high quality can be provided.

As illustrated in FIG. 1, the width in the first direction (e.g., X-axis direction) of the upper surface 60u of the insulating layer 60 is wider than the width in the first direction of the lower surface 50l of the second electrode 50. This further ensures the insulation between the first semiconductor layer 10 and the second electrode 50 and the insulation between the light emitting layer 30 and the second electrode 50 by the insulating layer 60.

In the semiconductor light emitting device 110, the second electrode 50 can be made reflective to the light emitted from the light emitting layer 30. Furthermore, the first electrode 40 can be made reflective to the light emitted from the light emitting layer 30. Thus, the light emitted from the light emitting layer 30 can be effectively extracted to the outside of the device.

The first electrode 40 can be a monolayer film of at least one of e.g. Ag, Al, and Pd, or a stacked film of two or more films thereof. The first electrode 40 is made of e.g. Ag or Ag alloy. The second electrode 50 can be a monolayer film of at least one of e.g. Ag, Al, and Pd, or a stacked film of two or more films thereof. The second electrode 50 is made of e.g. Ag or Ag alloy.

Figure 3:
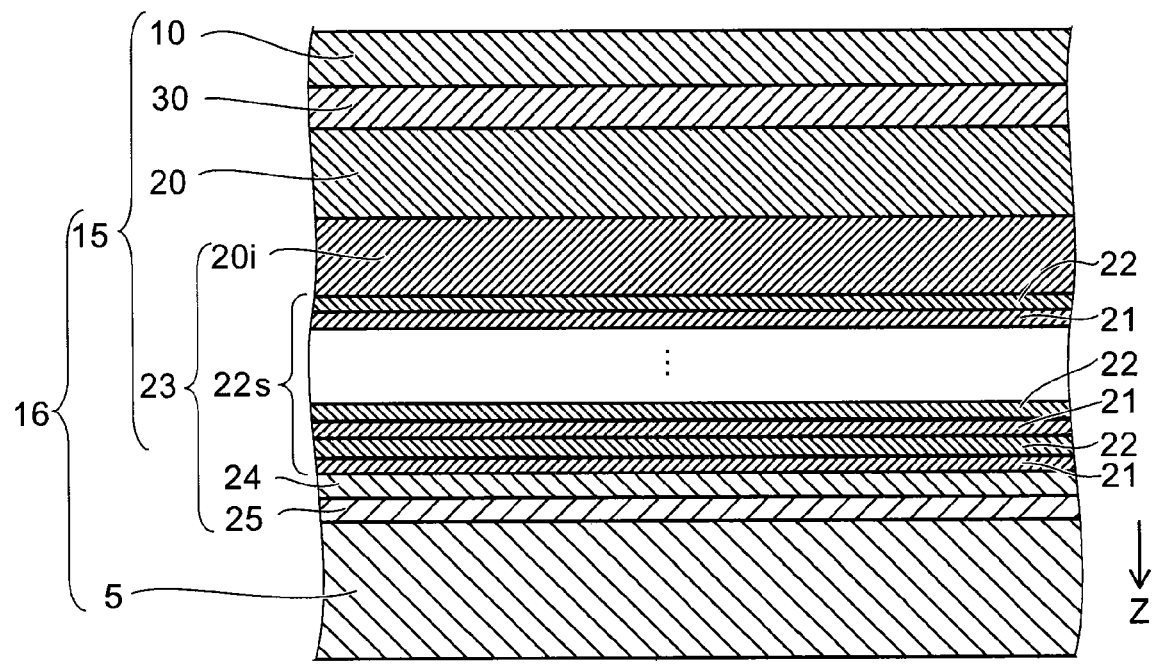
FIG. 3 is a schematic sectional view illustrating the configuration of the semiconductor light emitting device according to the first embodiment.

FIG. 3 is a schematic sectional view illustrating the configuration of the semiconductor light emitting device according to the first embodiment. FIG. 3 illustrates the state of the stacked semiconductor layer 15 being crystal grown. That is, FIG. 3 illustrates the state of the semiconductor light emitting device 110 in one manufacturing step.

As shown in FIG. 3, on a growth substrate 5, a stacked semiconductor layer 15 is epitaxially grown. The method for growing the stacked semiconductor layer 15 can be e.g. the metal-organic chemical vapor deposition (MOCVD) method or the metal-organic vapor phase epitaxy method. The growth substrate 5 and the stacked semiconductor layer 15 are included in a stacked body 16.

The growth substrate 5 is made of e.g. silicon (Si). The embodiment is not limited thereto. For instance, the growth substrate 5 is made of one of Si, $SiO_2$, quartz, sapphire, GaN, SiC, and GaAs. Here, the surface orientation of the growth substrate 5 is arbitrary. In the following, an example of using a Si substrate as the growth substrate 5 is described.

On the growth substrate 5, a third semiconductor layer 23 is formed. The third semiconductor layer 23 includes e.g. an AlN layer 25, an AlGaN layer 24, a stacked intermediate layer 22s, and an underlying layer 20i. The AlN layer 25 is formed on the growth substrate 5.

The AlN layer 25 is formed by low temperature growth or high temperature growth. In the case of low temperature growth, the formation temperature of the AlN layer 25 is e.g. 400° C. or more and 500° C. or less. In the case of low temperature growth, the thickness of the AlN layer 25 is e.g. 30 nm or more and 100 nm or less. In the case of high temperature growth, the formation temperature of the AlN layer 25 is e.g. 700° C. or more and 1200° C. or less. In the case of high temperature growth, the thickness of the AlN layer 25 is e.g. 100 nm or more and 300 nm or less. The AlN layer 25 may include a low temperature growth layer and a high temperature growth layer being stacked. At low formation temperature of the AlN layer 25, the thickness of the AlN layer 25 is made thinner than at high formation temperature. This facilitates maintaining the crystal quality.

The AlGaN layer 24 is formed on the AlN layer 25. The formation temperature of the AlGaN layer 24 is e.g. 800° C. or more and 1200° C. or less. The thickness of the AlGaN layer 24 is e.g. 300 nm or more and 2000 nm or less. The Al composition ratio in the AlGaN layer 24 is e.g. 0.15 or more and less than 1. The AlGaN layer 24 may include a plurality of layers different in composition. The AlGaN layer 24 may have a continuously changing composition.

The stacked intermediate layer 22s is formed on the AlGaN layer 24. The stacked intermediate layer 22s includes a plurality of first layers 21 and a plurality of second layers 22. The plurality of first layers 21 and the plurality of second layers 22 are alternately stacked. The first layer 21 is made of e.g. GaN. The second layer 22 is made of e.g. $Al_xGa_{1-x}N$ ($0<x\leq1$). The thickness of the first layer 21 is e.g. 150 nm or more and 1000 nm or less. The thickness of the second layer 22 is e.g. 10 nm or more and 500 nm or less. In this case, the number of stacked layers (the number of first layers 21 or the number of second layers 22) is 2 or more and 5 or less. Alternatively, the thickness of the first layer 21 is e.g. 300 nm or more and 2000 nm or less. The thickness of the second layer 22 is e.g. 10 nm or more and 500 nm or less. In this case, the number of stacked layers is 1 or more and 3 or less. The total thickness of the stacked intermediate layer 22s is e.g. 320 nm or more and 7500 nm or less. The formation temperature of the first layer 21 is e.g. 800° C. or more and 1200° C. or less. The formation temperature of the second layer 22 is e.g. 500° C. or more and 1200° C. or less. With regard to the relation of the thickness of each layer to the number of stacked layers, the thickness of each layer is preferably made thinner for a larger number of stacked layers in view of improvement in throughput and improvement in yield by reducing the time of film formation and suppressing cracks. That is, preferably, the total thickness of the stacked intermediate layer 22s is suppressed.

The underlying layer 20i is formed on the stacked intermediate layer 22s. The underlying layer 20i is made of e.g. GaN not doped with impurity (i-GaN). The formation temperature of the underlying layer 20i is e.g. 800° C. or more and 1200° C. or less. The thickness of the underlying layer 20i is e.g. 300 nm or more and 1500 nm or less.

A second semiconductor layer 20 is formed on the underlying layer 20i. A light emitting layer 30 is formed on the second semiconductor layer 20. A first semiconductor layer 10 is formed on the light emitting layer 30.

The underlying layer 20i is in contact with e.g. the second semiconductor layer 20. However, in the embodiment, another layer may be provided between the underlying layer 20i and the second semiconductor layer 20. For instance, the semiconductor light emitting device 110 may further include a stacked film provided between the underlying layer 20i and the second semiconductor layer 20. This stacked film includes e.g. a plurality of high bandgap energy layers and a plurality of low bandgap energy layers stacked alternately. The high bandgap energy layer is e.g. a GaN layer. The low bandgap energy layer is e.g. an InGaN layer. This stacked film provides e.g. good crystallinity.

The second semiconductor layer 20 includes e.g. a GaN layer containing n-type impurity. The n-type impurity can be e.g. at least one of Si, Ge, Te, and Sn. The second semiconductor layer 20 includes e.g. an n-side contact layer.

The first semiconductor layer 10 includes e.g. a GaN layer containing p-type impurity. The p-type impurity can be e.g. at least one of Mg, Zn, and C. The first semiconductor layer 10 includes e.g. a p-side contact layer.

In the semiconductor light emitting device 110, the third semiconductor layer 23 includes e.g. the underlying layer 20i. The third semiconductor layer 23 may further include e.g. at least a part of the stacked intermediate layer 22s. The third semiconductor layer 23 may further include the AlGaN layer 24 and the AlN layer 25.

Figure 4:
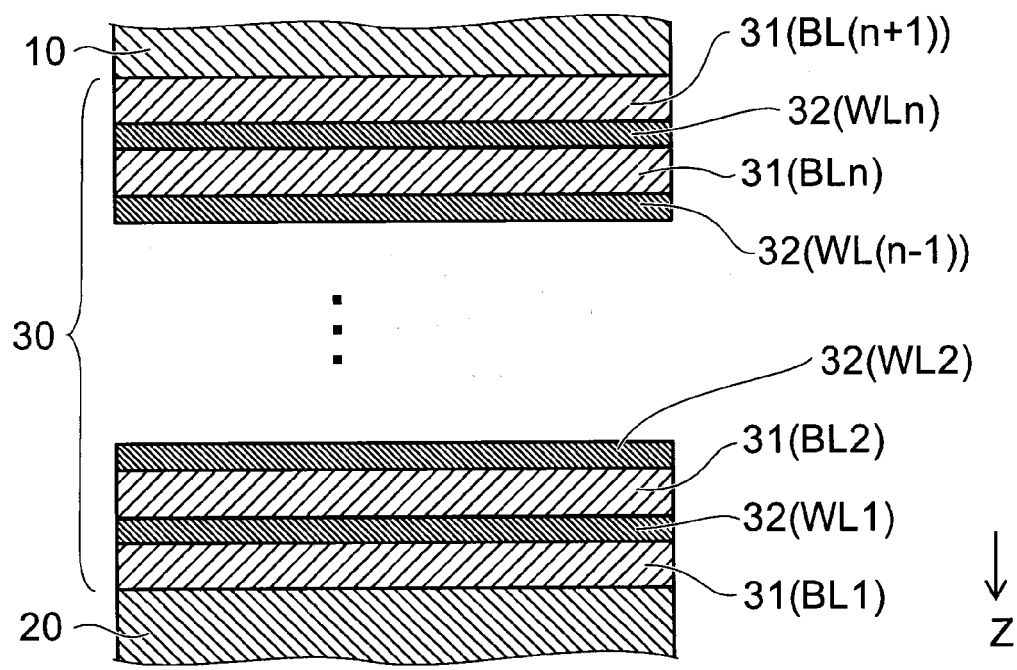
FIG. 4 is a schematic sectional view illustrating the configuration of the semiconductor light emitting device according to the first embodiment.

FIG. 4 is a schematic sectional view illustrating the configuration of the semiconductor light emitting device according to the first embodiment. FIG. 4 shows an example configuration of the light emitting layer 30.

As shown in FIG. 4, the light emitting layer 30 includes a plurality of barrier layers 31 and a well layer 32 provided between the plurality of barrier layers 31. For instance, a plurality of barrier layers 31 and a plurality of well layers 32 are alternately stacked along the Z-axis direction.

The well layer 32 includes $In_{x1}Ga_{1-x1}N$ ($0<x1\leq1$). The barrier layer 31 includes GaN. That is, the well layer 32 contains In, and the barrier layer 31 does not substantially contain In. The bandgap energy in the barrier layer 31 is larger than the bandgap energy in the well layer 32.

The light emitting layer 30 can have a single quantum well (SQW) configuration. In this case, the light emitting layer 30 includes two barrier layers 31 and a well layer 32 provided between the barrier layers 31. Alternatively, the light emitting layer 30 can have a multiple quantum well (MQW) configuration. In this case, the light emitting layer 30 includes three or more barrier layers 31 and well layers 32 each provided between a pair of barrier layers 31.

More specifically, the light emitting layer 30 includes e.g. n+1 barrier layers 31 and n well layers 32 (n is an integer of 2 or more). The (i+1)-th barrier layer BL(i+1) is placed between the i-th barrier layer BLi and the first semiconductor layer 10 (i is an integer of 1 or more and n−1 or less). The (i+1)-th well layer WL(i+1) is placed between the i-th well layer WLi and the first semiconductor layer 10. The first barrier layer BL1 is provided between the second semiconductor layer 20 and the first well layer WL1. The n-th well layer WLn is provided between the n-th barrier layer BLn and the (n+1)-th barrier layer BL(n+1). The (n+1)-th barrier layer BL(n+1) is provided between the n-th well layer WLn and the first semiconductor layer 10.

Figure 5:
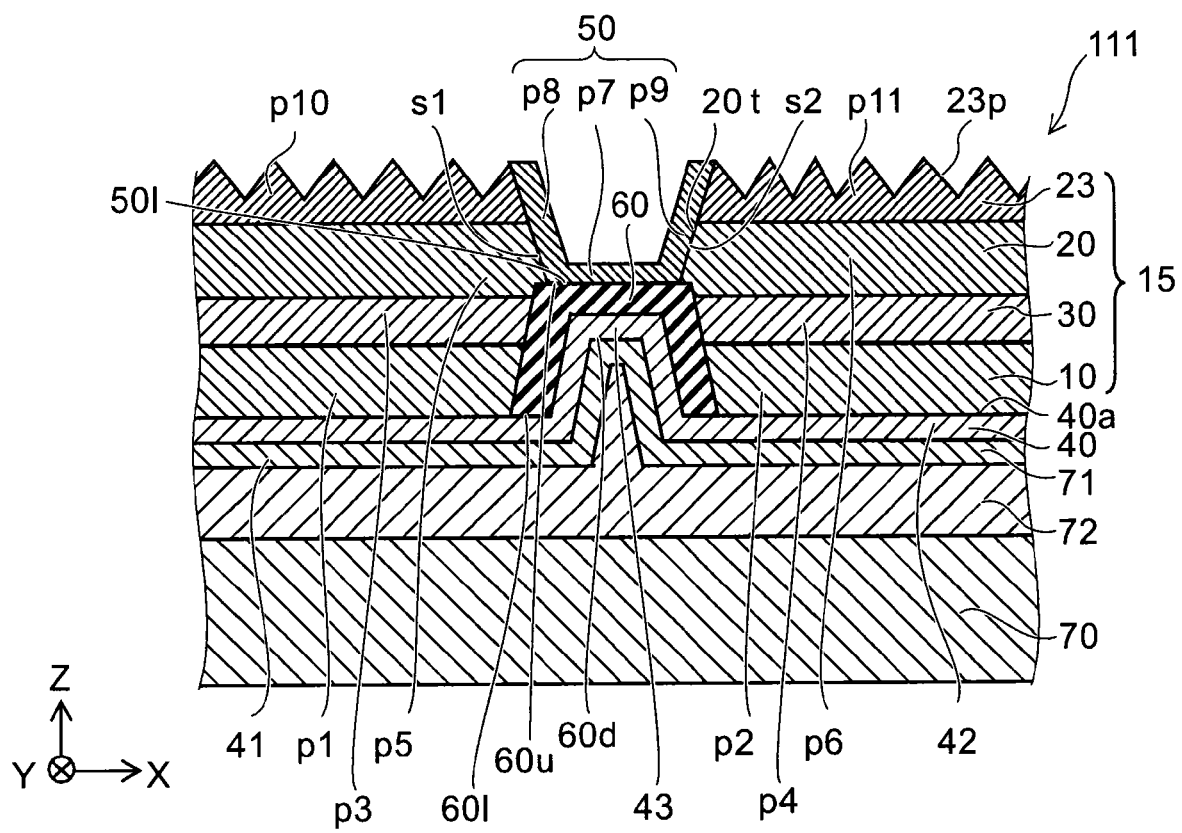
FIG. 5 is a schematic sectional view illustrating the configuration of an alternative semiconductor light emitting device according to the first embodiment.

FIG. 5 is a schematic sectional view illustrating the configuration of an alternative semiconductor light emitting device according to the first embodiment.

FIG. 5 is a sectional view corresponding to the cross section taken along line A1-A2 of FIG. 2.

As shown in FIG. 5, in the semiconductor light emitting device 111 according to this embodiment, the insulating layer 60 has a depression 60d provided in the lower surface 601 of the insulating layer 60. At least a part of the third region 43 of the first electrode 40 lies along the inner surface of the depression 60d. In other words, the third region 43 of the first electrode 40 is provided with a protrusion. The insulating layer 60 is provided along the protrusion. The rest can be made similar to the semiconductor light emitting device 110, and the description thereof is omitted.

In this example, a part of the third region 43 of the first electrode 40 includes a concave portion along the inner surface of the depression 60d. In this example, in the concave portion of the third region 43 of the first electrode 40, a part of the first intermediate conductive layer 71 is embedded. Furthermore, the second intermediate conductive layer 72 is embedded in the remaining space.

Also in this case, the first semiconductor layer 10 and the light emitting layer 30 are divided by the insulating layer 60. The second semiconductor layer 20 is divided by the second electrode 50 (i.e., second trench 20t). Thus, the stacked semiconductor layer 15 (including the third semiconductor layer 23 in this example) is divided into a plurality of regions. This can suppress crystallinity degradation and cracks. Thus, a semiconductor light emitting device of high quality can be provided.

Also in the semiconductor light emitting device 111, the width in the first direction (e.g., X-axis direction) of the upper surface 60u of the insulating layer 60 is wider than the width in the first direction of the lower surface 501 of the second electrode 50. This further ensures the insulation between the first semiconductor layer 10 and the second electrode 50 and the insulation between the light emitting layer 30 and the second electrode 50 by the insulating layer 60.

The width in the first direction (the direction from the first region 41 toward the second region 42) of the insulating layer 60 is e.g. 5 micrometers (μm) or more and 30 μm or less. If the width in the first direction of the insulating layer 60 is 5 μm or more, patterning is facilitated, which is desirable. If the width in the first direction of the insulating layer 60 is 30 μm or less, the area use efficiency of the epitaxial wafer is increased, which is desirable. The width in the first direction of the insulating layer 60 corresponds to the line width of the insulating layer 60. In the case where the insulating layer 60 has a tapered slope (side surface), the width in the first direction of the insulating layer 60 is defined as the width in the first direction of the insulating layer 60 at the center in the thickness direction (Z-axis direction) of the insulating layer 60.

The width in the first direction of the second electrode 50 is e.g. 3 μm or more and 20 μm or less. If the width in the first direction of the second electrode 50 is 3 μm or more, patterning is facilitated, which is desirable. If the width in the first direction of the second electrode 50 is 20 μm or less, the area use efficiency of the epitaxial wafer is increased, which is desirable. The width in the first direction of the second electrode 50 corresponds to the line width of the second electrode 50. In the case where the second electrode 50 has a tapered slope (side surface), the width in the first direction of the second electrode 50 is defined as the width in the first direction of the second electrode 50 at the center in the Z-axis direction of the second electrode 50.

The width along the first direction of the first region 41 and the width along the second direction of the second region 42 are e.g. 50 μm or more and 500 μm or less. The direction perpendicular to the stacking direction (Z-axis direction) and perpendicular to the first direction from the first region 41 toward the second region 42 is referred to as second direction. Here, the width along the first direction of the first region 41 is preferably equal to the width along the second direction of the first region 41. Likewise, the width along the first direction of the second region 42 is preferably equal to the width along the second direction of the second region 42. However, the width along the first direction of the first region 41 may be made different from the width along the second direction of the first region 41. Thus, for instance, even in the case where the stress is not uniform within the surface, the occurrence of cracks and the like can be suppressed more effectively.

Second Embodiment

The second embodiment relates to a method for manufacturing a semiconductor light emitting device.

In the following, an example method for manufacturing the semiconductor light emitting device 111 is described.

Figure 6:
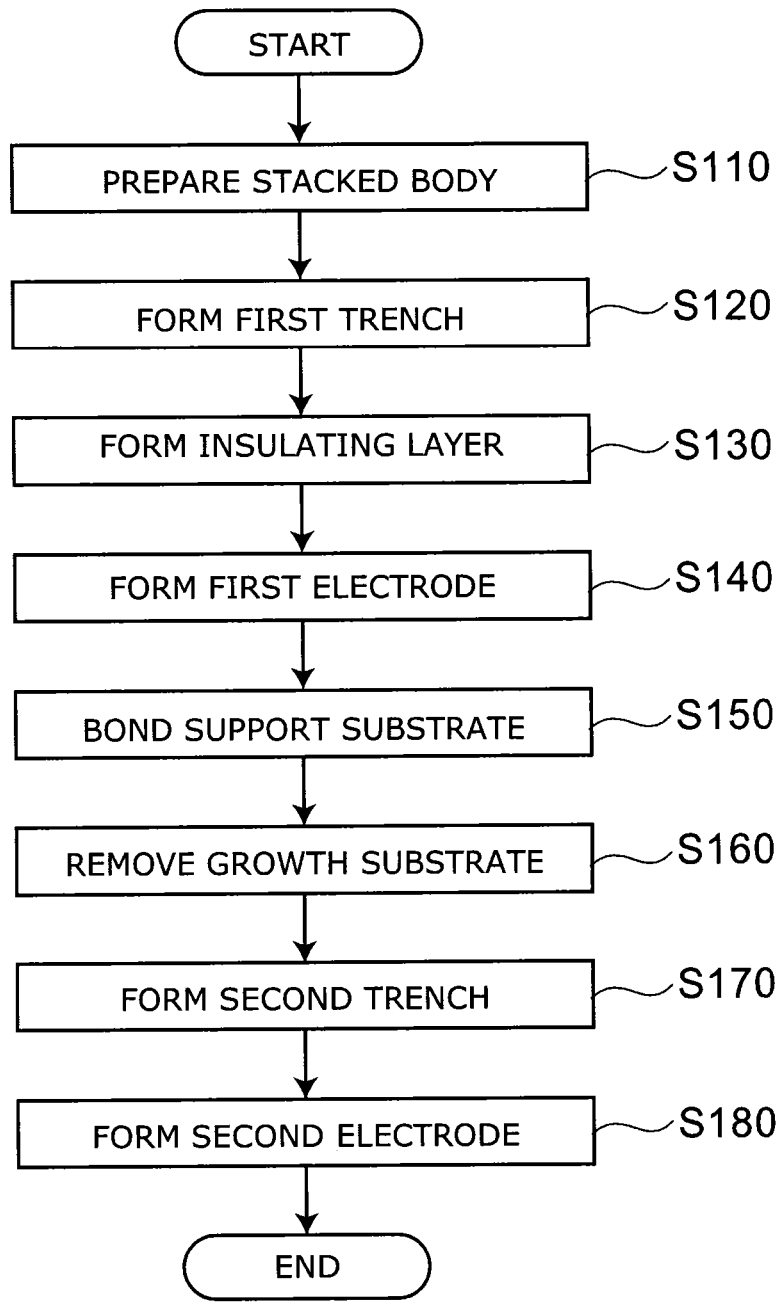
FIG. 6 is a flow chart illustrating a method for manufacturing a semiconductor light emitting device according to the second embodiment.

FIG. 6 is a flow chart illustrating a method for manufacturing a semiconductor light emitting device according to the second embodiment.

FIGS. 7A to 7H are sequential schematic sectional views illustrating the method for manufacturing a semiconductor light emitting device according to the second embodiment.

FIGS. 7A to 7H illustrate the cross section taken along line A3-A4 of FIG. 2 with partial omission.

Figure 7A:
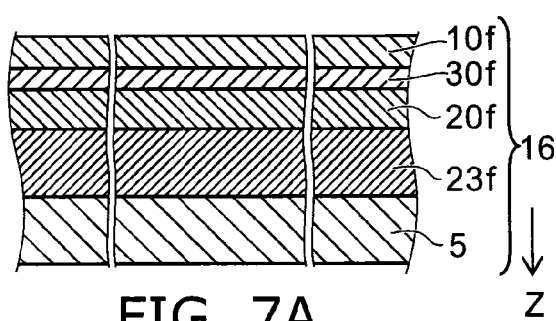
FIGS. 7A to 7H are sequential schematic sectional views illustrating the method for manufacturing a semiconductor light emitting device according to the second embodiment.

As shown in FIGS. 6 and 7A, a stacked body 16 is prepared (step S110). The stacked body 16 includes a growth substrate 5, a first semiconductor film 10f of the first conductivity type, a second semiconductor film 20f of the second conductivity type provided between the growth substrate 5 and the first semiconductor film 10f, and a light emitting film 30f provided between the first semiconductor film 10f and the second semiconductor film 20f. In this example, the stacked body 16 further includes a third semiconductor film 23f. The third semiconductor film 23f is provided between the growth substrate 5 and the second semiconductor film 20f.

The first semiconductor film 10f constitutes a first semiconductor layer 10. The second semiconductor film 20f constitutes a second semiconductor layer 20. The light emitting film 30f constitutes a light emitting layer 30. The third semiconductor film 23f constitutes a third semiconductor layer 23.

This manufacturing method may further include the step of forming a stacked body 16 (i.e., the step of growing a stacked semiconductor layer 15 on the growth substrate 5).

Figure 7E:
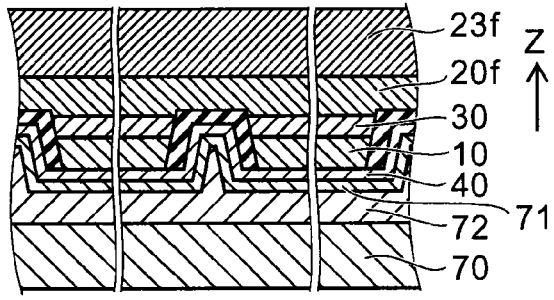
Figure 7B:
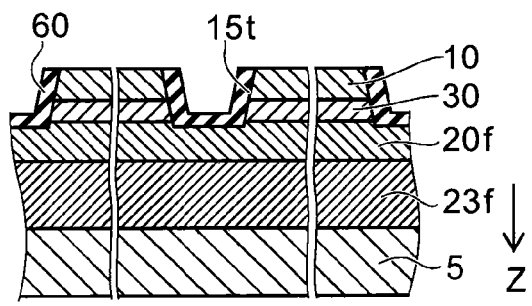

As shown in FIGS. 6 and 7B, a first trench 15t dividing the first semiconductor film 10f and the light emitting film 30f is formed (step S120). Thus, a first semiconductor layer 10 and a light emitting layer 30 are formed. The first trench 15t is provided along the region constituting the third region 43 of the first electrode 40. The first trench 15t may be further provided at a location dividing a plurality of devices from each other. In this example, the first trench 15t reaches the second semiconductor film 20f. However, the first trench 15t does not divide the second semiconductor film 20f.

As shown in FIGS. 6 and 7B, an insulating layer 60 is formed on the side surface of the first semiconductor film 10f and the side surface of the light emitting film 30f exposed in the first trench 15t (step S130). As the insulating layer 60, for instance, a $SiO_2$ film having a thickness of 50 nm or more and 600 nm or less is formed and processed into a prescribed shape. The insulating layer 60 is formed by e.g. vapor phase epitaxy or sputtering.

For instance, a $SiO_2$ film is formed on the entire surface of the workpiece. Then, etching is performed using a mask having a prescribed pattern shape. That is, the $SiO_2$ film is left in the region (first trench 15t) where the first semiconductor film 10f and the light emitting film 30f have been removed. The $SiO_2$ film is removed in the other region. Then, the upper surface of the first semiconductor film 10f (first semiconductor layer 10) is exposed.

As shown in FIG. 6, a first electrode 40 is formed on the upper surface of the first semiconductor film 10f (first semiconductor layer 10) and on the insulating layer 60 (step S140).

Figure 7F:
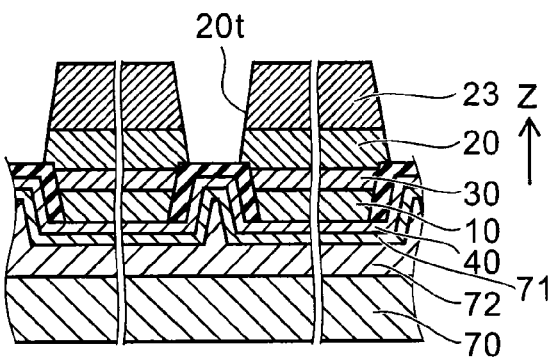
Figure 7C:
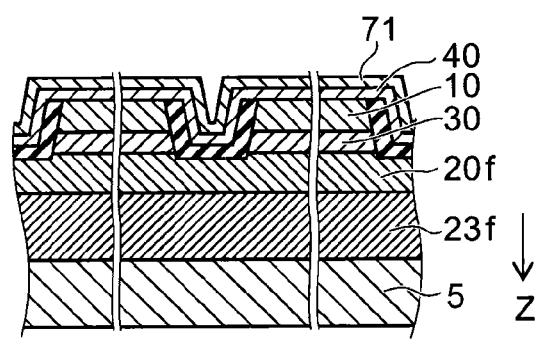

For instance, as shown in FIG. 7C, an Ag film constituting the first electrode 40 is formed entirely on the upper surface of the workpiece. The thickness of the Ag film is e.g. 100 nm or more and 400 nm or less. Furthermore, on the Ag film, a metal film constituting a first intermediate conductive layer 71 is formed. This metal film is made of e.g. Ti or Ti alloy. The thickness of this metal film is e.g. 10 nm or more and 200 nm or less. The first intermediate conductive layer 71 functions as a barrier metal.

As shown in FIG. 6, a conductive support substrate 70 is bonded to the first electrode 40 (step S150).

For instance, as the support substrate 70, a silicon substrate with a second intermediate conductive layer 72 (e.g., AuSn layer) provided on the major surface is prepared.

Figure 7G:
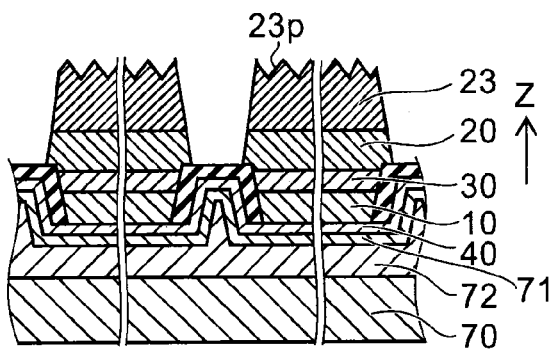
Figure 7D:
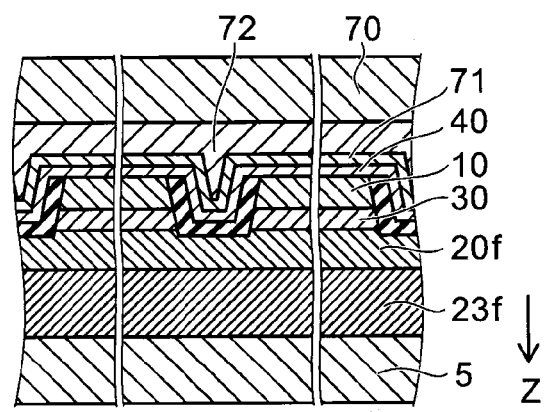

As shown in FIG. 7D, the first electrode 40 and the support substrate 70 are placed so that the first intermediate conductive layer 71 and the second intermediate conductive layer 72 oppose each other. Then, the first intermediate conductive layer 71 and the second intermediate conductive layer 72 are brought into contact with each other and heated to bond the first electrode 40 and the support substrate 70.

As shown in FIGS. 6 and 7E, the growth substrate 5 is removed (step S160). This removal is performed by e.g. at least one processing of grinding and etching.

As shown in FIGS. 6 and 7F, a second trench 20t dividing the second semiconductor film 20f and reaching the insulating layer 60 is formed (step S170). The second trench 20t is preferably forward tapered.

As shown in FIG. 7G, in this example, an unevenness 23p is formed on the surface of the third semiconductor film 23f. This unevenness 23p can be formed by e.g. wet processing with KOH and the like, or arbitrary dry etching processing and the like.

Figure 7H:
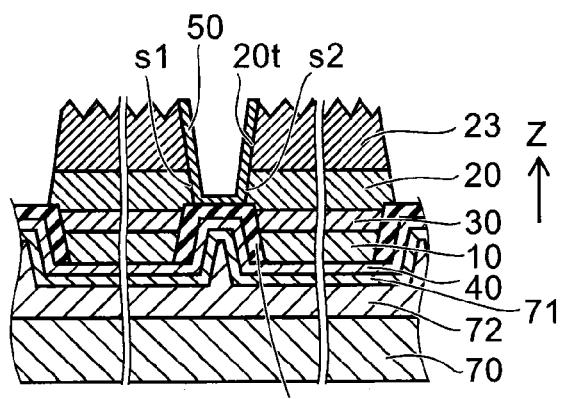

As shown in FIGS. 6 and 7H, a second electrode 50 is formed on the side surface (first side surface s1 and second side surface s2) of the second semiconductor film 20f exposed in the second trench 20t (step S180). In this example, the second electrode 50 is further provided also on the side surface of the third semiconductor layer 23.

Thus, the semiconductor light emitting device 111 is obtained.

The order of the above steps S110-S180 can be interchanged as long as technically feasible. At least two of the steps S110-S180 may be simultaneously performed as long as technically feasible.

The method for manufacturing a semiconductor light emitting device according to this embodiment can provide a method for manufacturing a semiconductor light emitting device of high quality capable of suppressing crystallinity degradation and cracks.

In this manufacturing method, forming a second electrode 50 (step S180) includes forming a second electrode 50 so that a part of the second electrode 50 is in contact with the insulating layer 60.

In this manufacturing method, the growth substrate 5 can be a silicon substrate. In this case, the first semiconductor film 10f, the second semiconductor film 20f, and the light emitting film 30f include nitride semiconductor. Thus, in the case of using materials having large difference in thermal expansion coefficient, this embodiment can be applied to suppress crystallinity degradation and cracks more effectively.

As described above, this manufacturing method further includes forming an unevenness 23p on the surface of the third semiconductor film 23f after removing the growth substrate 5. This third semiconductor film 23f is included in the stacked body 16. The third semiconductor film 23f is provided between the growth substrate 5 and the second semiconductor film 20f. The impurity concentration in the third semiconductor film 23f is lower than the impurity concentration in the second semiconductor film 20f.

The aforementioned first trench 15t divides the first semiconductor film 10f and the light emitting film 30f in a lattice configuration. For instance, the first trench 15t is formed along the lattice shape of the third region 43 illustrated in FIG. 2. Thus, the stacked semiconductor layer 15 is divided in a lattice configuration into a plurality of regions. Accordingly, the size of one region of the stacked semiconductor layer 15 can be reduced.

As projected on the plane (X-Y plane) parallel to the major surface of the first semiconductor film 10f, the second trench 20t lies along the first trench 15. Thus, the second semiconductor film 20f is divided corresponding to the position where the first semiconductor film 10f and the light emitting film 30f are divided.

Third Embodiment

Figure 8:
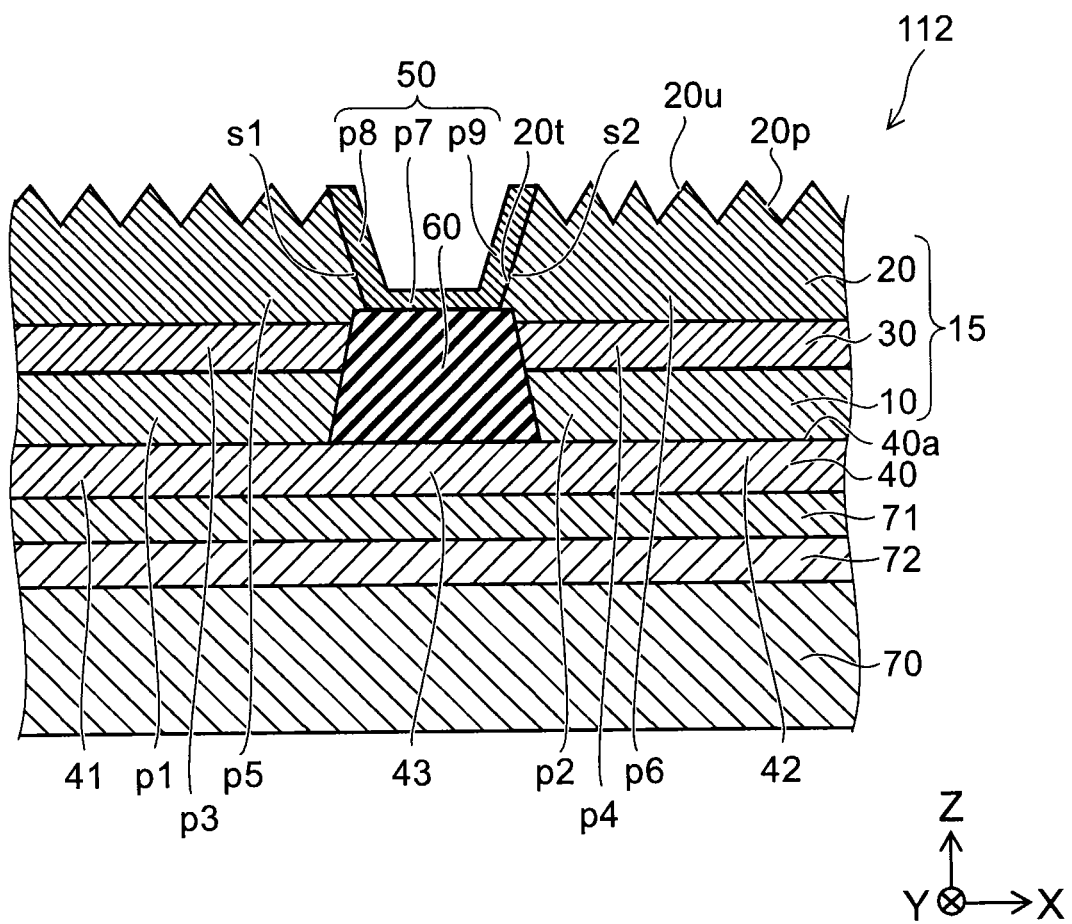
FIG. 8 is a schematic sectional view illustrating the configuration of a semiconductor light emitting device according to a third embodiment.

FIG. 8 is a schematic sectional view illustrating the configuration of a semiconductor light emitting device according to a third embodiment. FIG. 8 is a sectional view corresponding to the cross section taken along line A1-A2 of FIG. 2.

As shown in FIG. 8, in the semiconductor light emitting device 112 according to this embodiment, the third semiconductor layer 23 is not provided. The second semiconductor layer 20 has an unevenness 20p provided on the upper surface 20u of the second semiconductor layer 20. The rest can be made similar to the semiconductor light emitting device 110, and the description thereof is omitted.

The depth of the unevenness 20p provided on the second semiconductor layer 20 is 0.8 times or more and 5 times or less the peak wavelength of the light emitted from the light emitting layer 30. By the unevenness 20p, high light extraction efficiency is achieved.

In the case where the underlying layer 20i described with reference to FIG. 3 contains impurity of the second conductivity type (e.g., n-type), at least a part of the underlying layer 20i may be regarded as being included in the second semiconductor layer 20. In the case where the stacked intermediate layer 22s contains impurity of the second conductivity type, at least a part of the stacked intermediate layer 22s may be regarded as being included in the second semiconductor layer 20.

The semiconductor light emitting device 112 can also provide a semiconductor light emitting device of high quality capable of suppressing crystallinity degradation and cracks.

In the above semiconductor light emitting devices 110-112, as illustrated in FIG. 2, the stacked semiconductor layer 15 is divided into 4×4=16 regions. However, in the embodiment, the number of divided regions of the stacked semiconductor layer 15 is arbitrary.

FIGS. 9A to 9E are schematic plan views illustrating the configuration of semiconductor light emitting devices according to the embodiment.

These figures show examples of the division of the stacked semiconductor layer 15 (i.e., examples of the pattern of the first region 41, the second region 42, and the third region 43).

Figure 9A:
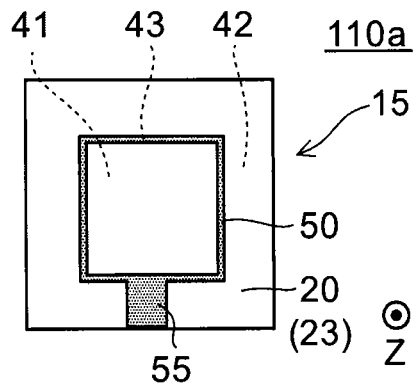
FIGS. 9A to 9E are schematic plan views illustrating the configuration of semiconductor light emitting devices according to the embodiment.

As shown in FIG. 9A, in the semiconductor light emitting device 110a according to the embodiment, the third region 43 has a shape of a rectangular frame configuration. The first region 41 is provided in the central portion of the planar shape of the device. The second region 42 is provided in the peripheral portion of the device. The third region 43 is placed therebetween. In this example, the stacked semiconductor layer 15 is divided into two regions.

Figure 9B:
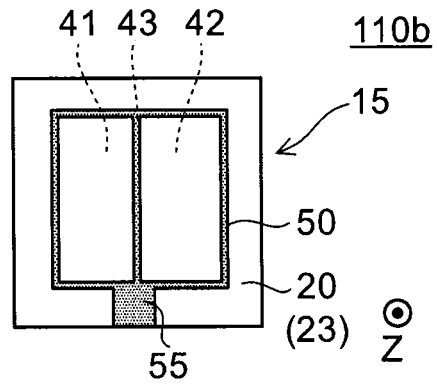

As shown in FIG. 9B, in the semiconductor light emitting device 110b according to the embodiment, the third region 43 has a rectangular frame and a line segment connecting two opposing sides of the rectangle. In this example, the stacked semiconductor layer 15 is divided into three regions.

Figure 9C:
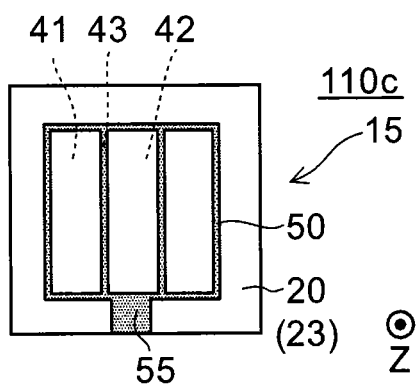

As shown in FIG. 9C, in the semiconductor light emitting device 110c according to the embodiment, the stacked semiconductor layer 15 is divided into four regions. In the semiconductor light emitting devices 110b and 110c, the third region 43 has a line segment region along one direction (e.g., Y-axis direction).

Figure 9D:
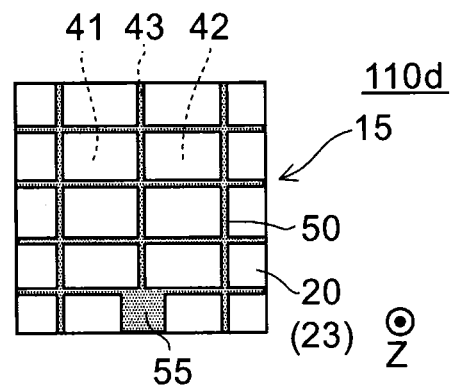

As shown in FIG. 9D, in the semiconductor light emitting device 110d according to the embodiment, the stacked semiconductor layer 15 is divided into 20 regions. In this example, the third region 43 has a shape of a lattice in two orthogonal directions (e.g., X-axis direction and Y-axis direction). As in this example, the pitch along the X-axis direction of line segments extending in the Y-axis direction of the third region 43 may be different from the pitch along the Y-axis direction of line segments extending in the X-axis direction of the third region 43.

Figure 9E:
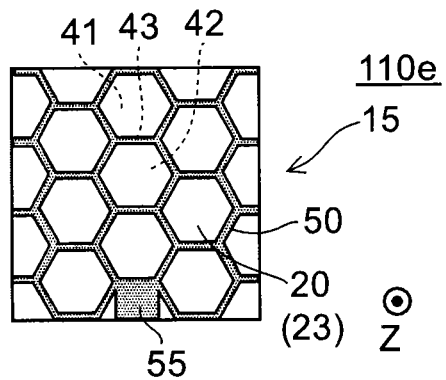

As shown in FIG. 9E, in the semiconductor light emitting device 110e according to the embodiment, the third region 43 has a shape of a part of a hexagonal frame. The shape of the third region 43 may be e.g. a shape corresponding to the crystal orientation of the semiconductor layer. This provides more stable characteristics.

In the semiconductor light emitting devices 110a-110c, the third region 43 does not reach the end surface of the device. In the semiconductor light emitting devices 110d and 110e, the third region 43 reaches the end surface of the device.

Thus, in the embodiment, the pattern of the first region 41, the second region 42, and the third region 43 is arbitrary. That is, the division of the stacked semiconductor layer 15 is arbitrary. The insulating layer 60 is provided along the third region 43, and the pattern of the insulating layer 60 is also arbitrary. The second electrode 50 is also provided along the third region 43, and the pattern of the second electrode 50 is also arbitrary.

In the embodiment, depending on the shape, direction, and number of the dividing lines, the second electrode 50 can have an arbitrary configuration and layout. Preferably, the second electrode 50 reaches the end surface of the semiconductor light emitting device. However, the second electrode 50 can have an arbitrary shape such as a closed line and rectangle inside the planar shape of the semiconductor light emitting device.

Figure 10:
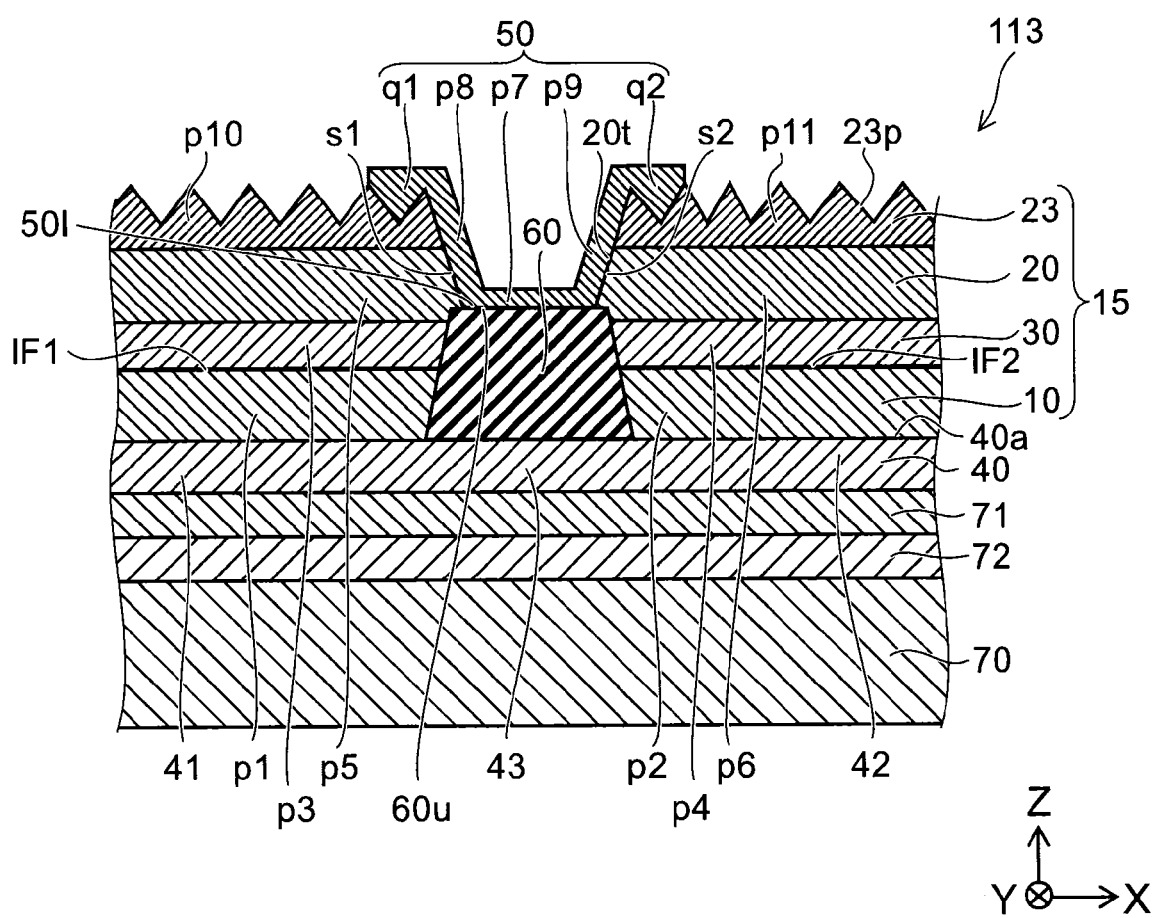
FIG. 10 is a schematic sectional view illustrating the configuration of a semiconductor light emitting device according to the embodiment.

FIG. 10 is a schematic sectional view illustrating the configuration of a semiconductor light emitting device according to the embodiment.

FIG. 10 is a sectional view corresponding to the cross section taken along line A1-A2 of FIG. 2.

As shown in FIG. 10, in the semiconductor light emitting device 113 according to the embodiment, the second electrode 50 includes a seventh portion p7 provided on the insulating layer 60, an eighth portion p8 in contact with the first side surface s1 of the fifth portion p5 opposing the sixth portion p6, and a ninth portion p9 in contact with the second side surface s2 of the sixth portion p6 opposing the fifth portion p5. Besides, the second electrode 50 further includes a portion q1 and a portion q2 overlying a part of the second semiconductor layer 20.

In this example, the portion q1 covers a part of the fifth portion p5 of the second semiconductor layer 20. The portion q2 covers a part of the sixth portion p6 of the second semiconductor layer 20. Specifically, the portion q1 covers a part of the tenth portion p10 of the third semiconductor layer 23 provided on the fifth portion p5. The portion q2 covers a part of the eleventh portion p11 of the third semiconductor layer 23 provided on the sixth portion p6. The rest can be made similar to the semiconductor light emitting device 110, and the description thereof is omitted.

Thus, the second electrode 50 may be further provided on a part of the upper surface of the second semiconductor layer 20 in addition to the side surface of the second semiconductor layer 20.

The semiconductor light emitting device 113 can also provide a semiconductor light emitting device of high quality capable of suppressing crystallinity degradation and cracks.

In the semiconductor light emitting device, the stacked semiconductor layer is formed on a heterogeneous substrate by heteroepitaxial growth. The stacked semiconductor layer is monocrystalline. Thus, in the stacked semiconductor layer, stress is accumulated, and cracks are likely to occur. A crack occurring in the stacked semiconductor layer results in a current path bypassing the pn junction. This decreases the efficiency and shortens the device lifetime. Furthermore, if the stacked semiconductor layer is partly removed or subjected to unevenness processing on the surface, then the stacked semiconductor layer under the residual stress is made non-uniform in the stress state and stress resistance. Thus, after such processing, cracks are more likely to occur.

In the embodiments, a trench dividing the stacked semiconductor layer is formed inside the device. This can relax the residual stress and suppress the occurrence of cracks. A conductive layer is formed on the wall surface of the formed trench to form a second electrode 50. On the side surface of the trench, ohmic contact is formed between the second electrode 50 and the second semiconductor layer 20. This promotes current spreading within the light emitting device surface.

Furthermore, the second electrode 50 can be made of Al having high reflectance. Thus, the light from the light emitting layer 30 can also be reflected and efficiently guided to the light extraction surface provided with unevenness processing. The embodiments can provide a semiconductor light emitting device having a stress relaxation structure and having high efficiency.

The embodiments can provide a semiconductor light emitting device of high quality and a method for manufacturing the same.

In this description, the "nitride semiconductor" includes semiconductors of the chemical formula $B_xIn_yAl_zGa_{1-x-y-z}N$ ($0 \leq x \leq 1, 0 \leq y \leq 1, x+y+z \leq 1$) of any compositions with the composition ratios x, y, and z varied in the respective ranges. Furthermore, the "nitride semiconductor" also includes those of the above chemical formula further containing group V elements other than N (nitrogen), those further containing various elements added to control various material properties such as conductivity type, and those further containing various unintended elements.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

The embodiments of the invention have been described above with reference to examples. However, the invention is not limited to these examples. For instance, any specific configurations of various components such as the first semiconductor layer, second semiconductor layer, third semiconductor layer, light emitting layer, first electrode, second electrode, support substrate, first intermediate conductive layer, second intermediate conductive layer, and growth substrate included in the semiconductor light emitting device are encompassed within the scope of the invention as long as those skilled in the art can similarly practice the invention and achieve similar effects by suitably selecting such configurations from conventionally known ones.

Further, any two or more components of the specific examples may be combined within the extent of technical feasibility and are included in the scope of the invention to the extent that the purport of the invention is included.

Moreover, all semiconductor light emitting devices and all methods for manufacturing the same practicable by an appropriate design modification by one skilled in the art based on the semiconductor light emitting device and the method for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A semiconductor light emitting device comprising:
   a first electrode having a major surface, the first electrode including a first region, a second region apart from the first region in a plane parallel to the major surface, and a third region provided between the first region and the second region;
   a first semiconductor layer of a first conductivity type, the first semiconductor layer including a first portion provided on the first region and a second portion provided on the second region;

a light emitting layer including a third portion provided on the first portion and a fourth portion provided on the second portion;
a second semiconductor layer of a second conductivity type, the second semiconductor layer including a fifth portion provided on the third portion and a sixth portion provided on the fourth portion, the fifth portion having a first side surface opposing the sixth portion, the sixth portion having a second side surface opposing the fifth portion;
an insulating layer provided between the first portion and the second portion on the third region and between the third portion and the fourth portion; and
a second electrode including a seventh portion provided on the insulating layer, an eighth portion in contact with the first side surface, and a ninth portion in contact with the second side surface.

2. The device according to claim 1, further comprising:
a third semiconductor layer including a tenth portion provided on the fifth portion and an eleventh portion provided on the sixth portion,
the third semiconductor layer having an impurity concentration lower than an impurity concentration in the fifth portion and lower than an impurity concentration in the sixth portion.

3. The device according to claim 2, wherein
at least one of the tenth portion and the eleventh portion has an unevenness provided on an upper surface of the third semiconductor layer, and
a depth of the unevenness is 0.8 times or more and 5 times or less of a peak wavelength of a light emitted from the light emitting layer.

4. The device according to claim 1, wherein
the eighth portion is in ohmic contact with the first side surface, and
the ninth portion is in ohmic contact with the second side surface.

5. The device according to claim 1, wherein a width of an upper surface of the insulating layer in a first direction is wider than a width of a lower surface of the second electrode in the first direction, and the first direction is direction from the first region toward the second region.

6. The device according to claim 1, wherein the insulating layer electrically insulates the first semiconductor layer from the second electrode, and electrically insulates the light emitting layer from the second electrode.

7. The device according to claim 1, wherein the second electrode is reflective to a light emitted from the light emitting layer.

8. The device according to claim 1, wherein the first electrode is reflective to a light emitted from the light emitting layer.

9. The device according to claim 1, wherein
at least one of the seventh portion and the eighth portion has an unevenness provided on an upper surface of the second semiconductor layer, and
a depth of the unevenness is 0.8 times or more and 5 times or less of a peak wavelength of a light emitted from the light emitting layer.

10. The device according to claim 1, wherein
the insulating layer has a depression provided in a lower surface of the insulating layer, and
at least a part of the third region of the first electrode lies along an inner surface of the depression.

11. The device according to claim 1, further comprising:
a support substrate, the support substrate being conductive, the first electrode being disposed between the support substrate and the first semiconductor layer;
a first intermediate conductive layer provided between the support substrate and the first electrode; and
a second intermediate conductive layer provided between the support substrate and the first intermediate conductive layer.

12. The device according to claim 1, wherein
the first region are provided in a plurality and the second region are provided in a plurality,
the first regions are arranged along a direction parallel to the major surface, and
the second regions are arranged along the direction parallel to the major surface.

13. The device according to claim 1, wherein a distance from a first interface between the first portion and the third portion to the first electrode is equal to a distance from a second interface between the second portion and the fourth portion to the first electrode.

14. The device according to claim 1, wherein a crystal orientation in the first portion is equal to a crystal orientation in the second portion.

15. A method for manufacturing a semiconductor light emitting device, comprising:
preparing a stacked body including a growth substrate, a first semiconductor film of a first conductivity type, a second semiconductor film of a second conductivity type provided between the growth substrate and the first semiconductor film, and a light emitting film provided between the first semiconductor film and the second semiconductor film;
forming a first trench dividing the first semiconductor film and the light emitting film;
forming an insulating layer on a side surface of the first semiconductor film exposed in the first trench and a side surface of the light emitting film exposed in the first trench;
forming a first electrode on an upper surface of the first semiconductor film and on the insulating layer;
bonding a support substrate to the first electrode, the support substrate being conductive;
removing the growth substrate;
forming a second trench to divide the second semiconductor film and to reach the insulating layer; and
forming a second electrode on a side surface of the second semiconductor film exposed in the second trench.

16. The method according to claim 15, wherein the forming a second electrode includes forming the second electrode so that a part of the second electrode is in contact with the insulating layer.

17. The method according to claim 15, wherein
the growth substrate is a silicon substrate, and
the first semiconductor film, the second semiconductor film, and the light emitting film include nitride semiconductor.

18. The method according to claim 15, further comprising:
forming an unevenness on a surface of a third semiconductor film after removing the growth substrate,
the third semiconductor film being included in the stacked body, the third semiconductor film being provided between the growth substrate and the second semiconductor film, and the third semiconductor film having an impurity concentration lower than an impurity concentration in the second semiconductor film.

19. The method according to claim 15, wherein the first trench divides the first semiconductor film and the light emitting film in a lattice configuration.

20. The method according to claim 15, wherein the second trench aligns along the first trench when projected on a plane parallel to a major surface of the first semiconductor film.

* * * * *